(12) United States Patent
Park

(10) Patent No.: US 10,779,416 B2
(45) Date of Patent: Sep. 15, 2020

(54) APPARATUS AND METHOD FOR DETECTING ION MIGRATION

(71) Applicant: HYUNDAI MOBIS CO., LTD., Seoul (KR)

(72) Inventor: Jae Hyun Park, Yongin-si (KR)

(73) Assignee: HYUNDAI MOBIS CO., LTD., Seoul (KR)

(*) Notice: Subject to any disclaimer, the term of this patent is extended or adjusted under 35 U.S.C. 154(b) by 0 days.

(21) Appl. No.: 16/587,401

(22) Filed: Sep. 30, 2019

(65) Prior Publication Data

US 2020/0128678 A1  Apr. 23, 2020

(30) Foreign Application Priority Data

Oct. 22, 2018 (KR) .................... 10-2018-0125929

(51) Int. Cl.
*H05K 1/14* (2006.01)
*H05K 3/46* (2006.01)
*H05K 3/22* (2006.01)
*G01N 27/62* (2006.01)

(52) U.S. Cl.
CPC ............ *H05K 3/22* (2013.01); *G01N 27/622* (2013.01); *H05K 1/141* (2013.01); *H05K 3/4638* (2013.01); *H05K 2201/099* (2013.01); *H05K 2203/092* (2013.01)

(58) Field of Classification Search
CPC .. H05K 1/0266; H05K 1/0268; H05K 1/0269; H05K 1/14; H05K 1/141; H05K 1/142; H05K 1/144; H05K 1/145; H05K 1/147; H05K 3/4638
See application file for complete search history.

(56) References Cited

U.S. PATENT DOCUMENTS

2015/0097185 A1* 4/2015 Bae .................. H01L 23/481
257/48

FOREIGN PATENT DOCUMENTS

JP   2011-163925 A    8/2011
KR   10-2017-0033813 A   3/2017

OTHER PUBLICATIONS

Office Action of corresponding Korean Patent Application No. 10-2018-0125929—5 pages (dated Jan. 2, 2020).

* cited by examiner

*Primary Examiner* — Jeremy C Norris
(74) *Attorney, Agent, or Firm* — Knobbe Martens Olson & Bear LLP

(57) ABSTRACT

Disclosed herein may be an apparatus and method for detecting ion migration. The apparatus may include: a first printed circuit board (PCB) pad coupled with a ground; a second PCB pad disposed at a position spaced apart from the first PCB pad; a power supply unit configured to supply power to the second PCB pad; a voltage detection unit configured to detect a voltage of an output terminal of the first PCB pad; and a control unit configured to determine whether ion migration has occurred between the first PCB pad and the second PCB pad using the voltage detected by the voltage detection unit.

14 Claims, 6 Drawing Sheets

APPARATUS AND METHOD FOR DETECTING ION MIGRATION

CROSS-REFERENCES TO RELATED APPLICATIONS

The present application claims priority to Korean application number 10-2018-0125929, filed on Oct. 22, 2018, which is incorporated by reference in its entirety.

BACKGROUND OF THE INVENTION

The present invention relates to an apparatus and method for detecting ion migration, and more particularly, to an apparatus and method for detecting ion migration which occurs between printed circuit board (PCB) pads, based on a change in voltage of a PCB pad due to by-products generated by the ion migration.

As digitalization of vehicles is accelerated, the number of electronic control units (ECUs) installed in a vehicle tends to increase.

An ECU includes an electronic circuit, a micro control unit (MCU), a sensor interface, a communication module, etc.

As a vehicle provided with a lot of electronic components is operated under various environments including poor conditions, liquid such as water or brake oil may be drawn into the ECU.

As such, if a PCB of the ECU is exposed to various kinds of liquid while being operated, ion migration may occur between portions in the ECU which have a relatively high voltage difference therebetween and are spaced apart from each other by a relatively small distance. Subsequently, as time passes, a problem such as a short circuit or a fire may be caused in the ECU.

To overcome the above problem, in the conventional art, research on forming a film, a cured film, or the like for mitigating ion migration has been conducted. However, such research is focused on the technology of mitigating ion migration but lacks in terms of rapidly and precisely detecting ion migration in an ECU.

The related art of the present invention is disclosed in Korean Patent Unexamined Publication No. 2017-0033813 published on Mar. 27, 2017 and entitled "Resin composition for forming cured film, cured film, electrically conductive member, and method for preventing migration".

SUMMARY OF THE INVENTION

Embodiments of the present invention are directed to an apparatus and method for detecting ion migration which occurs between printed circuit board (PCB) pads, based on a change in voltage of a PCB pad due to by-products generated by the ion migration.

In one embodiment, an apparatus for detecting ion migration may include: a first printed circuit board (PCB) pad coupled with a ground; a second PCB pad disposed at a position spaced apart from the first PCB pad; a power supply unit configured to supply power to the second PCB pad; a voltage detection unit configured to detect a voltage of an output terminal of the first PCB pad; and a control unit configured to determine whether ion migration has occurred between the first PCB pad and the second PCB pad using the voltage detected by the voltage detection unit.

The control unit may determine whether the ion migration has occurred depending on whether the voltage detected by the voltage detection unit is a preset value or more.

The control unit may determine whether the ion migration has occurred depending on whether a plurality of areas in each of which the voltage detected by the voltage detection unit is out of a preset range are present.

A facing surface of the first PCB pad and a facing surface of the second PCB pad each may have a saw tooth shape.

A facing surface of the first PCB pad and a facing surface of the second PCB pad each may have a shape with protrusions and depressions that are alternately formed.

A facing surface of the first PCB pad and a facing surface of the second PCB pad each may have a wavy shape.

The apparatus may further include a warning unit configured to warn of PCB contamination when the control unit determines that ion migration has occurred between the first PCB pad and the second PCB pad.

The apparatus may further include a power disconnection unit configured to interrupt power to be supplied to an electronic control unit (ECU) or an actuator, when the control unit determines that ion migration has occurred between the first PCB pad and the second PCB pad.

In another embodiment, a method for detecting ion migration may include: detecting, by a voltage detection unit, a voltage of an output terminal of a first printed circuit board (PCB) pad disposed at a position spaced apart from a second PCB pad; and determining, by a control unit, whether ion migration has occurred between the first PCB pad and the second PCB pad using the voltage detected by the voltage detection unit.

In the determining of whether the ion migration has occurred, the control unit may determine whether the ion migration has occurred depending on whether the voltage detected by the voltage detection unit is a preset value or more.

In the determining of whether the ion migration has occurred, the control unit may determine whether the ion migration has occurred depending on whether a plurality of areas in each of which the voltage detected by the voltage detection unit is out of a preset range are present.

A facing surface of the first PCB pad and a facing surface of the second PCB pad each may have a saw tooth shape.

A facing surface of the first PCB pad and a facing surface of the second PCB pad each may have a shape with protrusions and depressions that are alternately formed.

A facing surface of the first PCB pad and a facing surface of the second PCB pad each may have a wavy shape.

The method may further include warning of PCB contamination, by a warning unit, when the control unit determines that ion migration has occurred between the first PCB pad and the second PCB pad.

The method may further include interrupting, by a power disconnection unit, power to be supplied to an electronic control unit (ECU) or an actuator, when the control unit determines that ion migration has occurred between the first PCB pad and the second PCB pad.

An apparatus and method for detecting ion migration in accordance with an embodiment of the present invention may detect ion migration which occurs between PCB pads, based on a change in voltage of the PCB pads due to by-products generated by the ion migration.

An apparatus and method for detecting ion migration in accordance with an embodiment of the present invention may rapidly and precisely detect ion migration and warn an occupant in a vehicle against malfunction of an electronic controller, and may interrupt the power of an ECU when ion migration is detected, thus fundamentally preventing a fire from occurring due to a short circuit in the ECU.

DESCRIPTION OF SPECIFIC EMBODIMENTS

Figure 1:
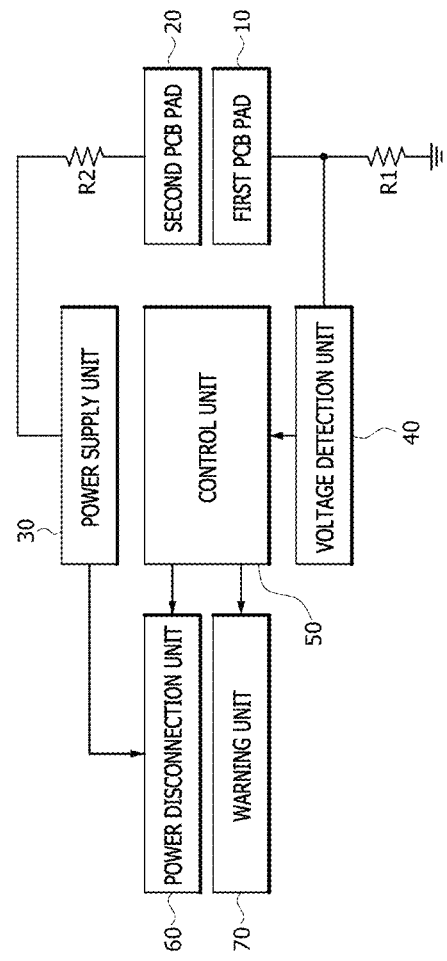
FIG. 1 is a block diagram illustrating an apparatus for detecting ion migration in accordance with an embodiment of the present invention.

As is traditional in the corresponding field, some exemplary embodiments may be illustrated in the drawings in terms of functional blocks, units, and/or modules. Those of ordinary skill in the art will appreciate that these block, units, and/or modules are physically implemented by electronic (or optical) circuits such as logic circuits, discrete components, processors, hard-wired circuits, memory elements, wiring connections, and the like. When the blocks, units, and/or modules are implemented by processors or similar hardware, they may be programmed and controlled using software (e.g., code) to perform various functions discussed herein. Alternatively, each block, unit, and/or module may be implemented by dedicated hardware or as a combination of dedicated hardware to perform some functions and a processor (e.g., one or more programmed processors and associated circuitry) to perform other functions. Each block, unit, and/or module of some exemplary embodiments may be physically separated into two or more interacting and discrete blocks, units, and/or modules without departing from the scope of the inventive concept. Further, blocks, units, and/or module of some exemplary embodiments may be physically combined into more complex blocks, units, and/or modules without departing from the scope of the inventive concept.

Hereinafter, an apparatus and method for detecting ion migration in accordance with an embodiment of the present invention will be described in detail with reference the accompanying drawings. It should be noted that the drawings are not to precise scale and may be exaggerated in thickness of lines or sizes of components for descriptive convenience and clarity only. The terms and words used for elements in the description of the present invention are determined based on the functions of the elements in the present invention. The terms and words may be changed depending on the intention or custom of users or operators, so that they must be defined based on the whole content of the present specification. Therefore, definition of the terms should be made according to the overall disclosures set forth herein.

Figure 2:
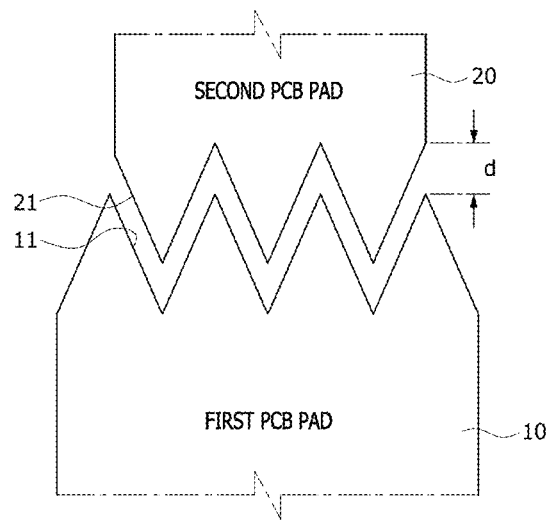
FIG. 2 is a diagram illustrating an example of an ion migration generation unit in accordance with an embodiment of the present invention.
Figure 3:
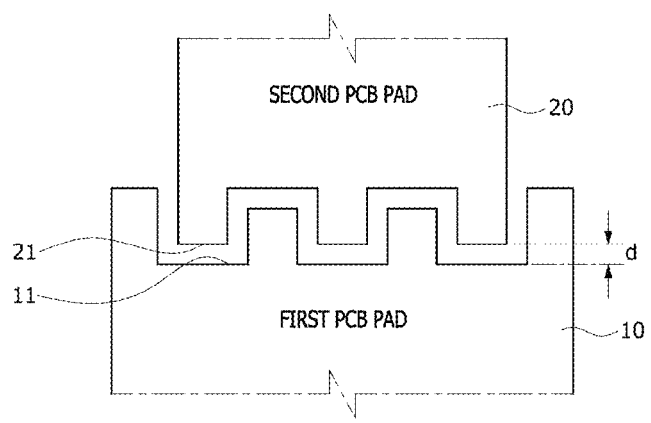
FIG. 3 is a diagram illustrating another example of the ion migration generation unit in accordance with an embodiment of the present invention.
Figure 4:
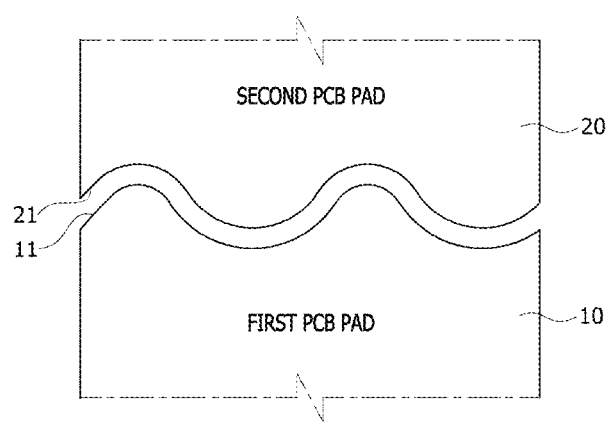
FIG. 4 is a diagram illustrating another example of the ion migration generation unit in accordance with an embodiment of the present invention.

FIG. 1 is a block diagram illustrating an apparatus for detecting ion migration in accordance with an embodiment of the present invention, FIG. 2 is a diagram illustrating an example of an ion migration generation unit in accordance with an embodiment of the present invention, FIG. 3 is a diagram illustrating another example of the ion migration generation unit in accordance with an embodiment of the present invention, and FIG. 4 is a diagram illustrating another example of the ion migration generation unit in accordance with an embodiment of the present invention.

Referring to FIG. 1, the ion migration detecting apparatus in accordance with an embodiment of the present invention may include a first (printed circuit board) PCB pad 10, a second PCB pad 20, a power supply unit 30, a voltage detection unit 40, a control unit 50, a power disconnection unit 60, and a warning unit 70.

The first PCB pad 10 is a terminal member which is installed on a PCB of an electronic control unit (ECU) and electrically coupled with a ground through a resistor R1. The first PCB pad 10 may be formed on at least one area of the PCB by pattern printing or plating.

The second PCB pad 20 is a terminal member which is installed on the PCB of the ECU and coupled with the power supply unit 30 through a resistor R2. Here, the second PCB pad 20 may be formed on at least one area of the PCB by pattern printing or plating.

Since as described above the second PCB pad 20 is coupled with the power supply unit 30, the second PCB pad 20 may be supplied with a preset voltage from the power supply unit 30.

The second PCB pad 20 may be disposed at a position spaced apart from the first PCB pad 10 within a preset distance d. The distance between the first PCB pad 10 and the second PCB pad 20 may be set to various values depending on a voltage detected between the first PCB pad 10 and the second PCB pad 20 by migration.

In other words, a plurality of first PCB pads 10 and a plurality of second PCB pads 20 may be disposed on the PCB at positions spaced apart from each other by a preset distance d. Particularly, the first and second PCB pads 10 and 20 may be evenly distributed on the PCB or disposed in an area with a comparatively high possibility of detection of ion migration. This will be described later herein.

The voltage detection unit 40 is coupled to an output terminal of the first PCB pad 10 to detect the voltage of the output terminal of the first PCB pad 10.

If ion migration is not generated between the first PCB pad 10 and the second PCB pad 20, the voltage detection unit 40 may detect a voltage of 0V. However, if ion migration occurs between the first PCB pad 10 and the second PCB pad 20 because of liquid which is present in the ECU, e.g., by brake oil or water introduced into the ECU, insulation breakdown occurs between the first PCB pad 10 and the second PCB pad 20 due to by-products generated by the ion migration. Hence, a short circuit occurs between the first PCB pad 10 and the second PCB pad 20, whereby leakage current occurs therebetween.

Due to such leakage current between the first PCB pad 10 and the second PCB pad 20, the voltage detection unit 40 may detect a higher voltage than before the short circuit occurs between the first PCB pad 10 and the second PCB pad 20.

Typically, brake oil and water are main contaminants in brake components. In the case where two kinds of liquid meet and are present on the PCB, as the amount of water in the brake oil is increased and the temperature in the ECU is increased, resistance is reduced, whereby the risk of malfunction increases. Due to circuit characteristics of ion migration, short circuits are substantially repeatedly caused or interrupted. Therefore, if a relatively high voltage is detected or detection of such voltages is repeated at a preset count or more within a preset period, it may be determined that ion migration has occurred. Furthermore, in the case where in a circuit the voltage repeatedly changes at a preset count or more, only a seriously contaminated component rather than the entirety of the apparatus may be replaced with a new one. Hence, the maintenance cost may be reduced.

For example, if leakage current is generated between a positive power supply (B+) terminal of the first PCB pad 10 and a ground (GND) terminal of the second PCB pad 20, a voltage measured by the voltage detection unit 40 is increased to a preset value or more. In this case, due to excessive contamination of the ECU, it is impossible to secure normal operation of a product.

Here, the preset value is a voltage which is a criterion for determining that ion migration has occurred between the first PCB pad 10 and the second PCB pad 20 due to leakage current between the B+ terminal of the first PCB pad 10 and the GND terminal of the second PCB pad 20. The preset value may be previously set to various values depending on thicknesses, intervals, etc. of PCB patterns.

Furthermore, if leakage current occurs between circuit component lead pins or circuit component bodies in the ECU, a plurality of areas in each of which the voltage detected by the voltage detection unit 40 is out of a preset range may be generated. In this case, the circuit function of the ECU may be lost.

Here, the preset range is a voltage range which is a criterion for determining that ion migration has occurred between the first PCB pad 10 and the second PCB pad 20 due to leakage current between the circuit component lead pins or the circuit component bodies in the ECU. The preset range is previously set to various values depending on distances, etc. between the circuit component lead pins or the circuit component bodies in the ECU which are formed of PCB patterns.

If it is determined that ion migration occurs between the first PCB pad 10 and the second PCB pad 20, the warning unit 70 warns of contamination of the PCB because of the ion migration. The warning unit 70 may warn of the contamination of the PCB in various manners using an image, a warning light, or a sound. A cluster or the like of a vehicle may be employed as the warning unit 70.

If it is determined that ion migration has occurred between the first PCB pad 10 and the second PCB pad 20, the power disconnection unit 60 interrupts power to be supplied from the power supply unit 30 to the ECU, other actuators, or the like.

In this case, even if a control signal is inputted from the control unit 50, the power disconnection unit 60 may immediately interrupt power to be supplied to the ECU, or may interrupt power after a preset time has passed or a current operation of the ECU has stopped.

The control unit 50 may detect, based on a voltage detected by the voltage detection unit 40, ion migration which occurs between the first PCB pad 10 and the second PCB pad 20.

If ion migration occurs between the first PCB pad 10 and the second PCB pad 20, a short circuit is caused between the first PCB pad 10 and the second PCB pad 20, as described above. Hence, a voltage detected on the output terminal of the first PCB pad 10 is relatively increased.

Given this, the control unit 50 determines whether ion migration has occurred between the first PCB pad 10 and the second PCB pad 20, depending on whether the voltage detected by the voltage detection unit 40 is the preset value or more or whether a plurality of areas in each of which the voltage detected by the voltage detection unit 40 is out of the preset range are detected.

For example, if ion migration occurs between the first PCB pad 10 and the second PCB pad 20 because of liquid which is present in the ECU, e.g., by brake oil or water introduced into the ECU, insulation breakdown occurs between the first PCB pad 10 and the second PCB pad 20 due to by-products generated by the ion migration. Hence, a short circuit occurs between the first PCB pad 10 and the second PCB pad 20, whereby leakage current occurs therebetween.

Such leakage current may occur between the B+ terminal of the first PCB pad 10 or the GND terminal of the second PCB pad 20, or between circuit component lead pins or circuit component bodies in the ECU.

The control unit 50 determines whether the voltage detected by the voltage detection unit 40 is the preset value or more. If the voltage detected by the voltage detection unit 40 is the preset value or more, the control unit 50 determines that ion migration has occurred between the first PCB pad 10 and the second PCB pad 20.

Furthermore, the control unit 50 determines whether the voltage detected by the voltage detection unit 40 is out of the preset range, and determines whether a plurality of areas in each of which the voltage detected by the voltage detection unit 40 is out of the preset range have been detected. As a result of the determination, if a plurality of areas in each of which the voltage detected by the voltage detection unit 40 is out of the preset range have been detected, the control unit 50 determines that ion migration has occurred between the first PCB pad 10 and the second PCB pad 20.

If it is determined that ion migration has occurred between the first PCB pad 10 and the second PCB pad 20 based on the voltage detected by the voltage detection unit 40, the control unit 50 interrupts, through the power disconnection unit 60, power to be supplied to the ECU, or warns of contamination of the PCB through the warning unit 70, thus preventing a short circuit, a fire, or the like in the ECU, and making it possible for an occupant in the vehicle to recognize the contamination of the PCB of the ECU.

On the one hand, to increase the possibility of detection of ion migration on the PCB and ion migration recognition ability, there is a need for the ion migration to rapidly grow.

Ion migration occurs due to a potential difference between the first PCB pad 10 and the second PCB pad 20. Hence, to relatively increase the potential difference, the first PCB pad 10 and the second PCB pad 20 may be disposed such that respective facing surfaces 11 and 21 of the first and second PCB pads 10 and 20 are spaced apart from each other by the preset distance d, and may be formed in various shapes so that the surface areas of the facing surfaces 11 and 21 can be increased.

For example, the facing surface 11 of the first PCB pad 10 and the facing surface 21 of the second PCB pad 20 each may have, as shown in FIG. 2, a sawtooth shape, may have, as shown in FIG. 3, a shape having protrusions and depressions that are alternately formed, or may have, as shown in FIG. 4, a wavy shape.

For reference, although in the present embodiment there has been illustrated the case where the facing surface 11 of the first PCB pad 10 and the facing surface 21 of the second PCB pad 20 each have a sawtooth shape, a shape having protrusions and depressions that are alternately formed, or a wavy shape, the present invention is not limited thereto, and they may be changed in various ways depending on a change in settings, a set voltage, the thicknesses or intervals of the PCB patterns, the structure of PCB, etc.

Furthermore, the first PCB pads 10 and the second PCB pads 20 may be evenly distributed on the PCB so that the possibility of detection of ion migration can be further enhanced.

Hereinafter, a method for detecting ion migration in accordance with an embodiment of the present invention will be described in detail with reference to FIGS. 5 and 6.

Figure 5:
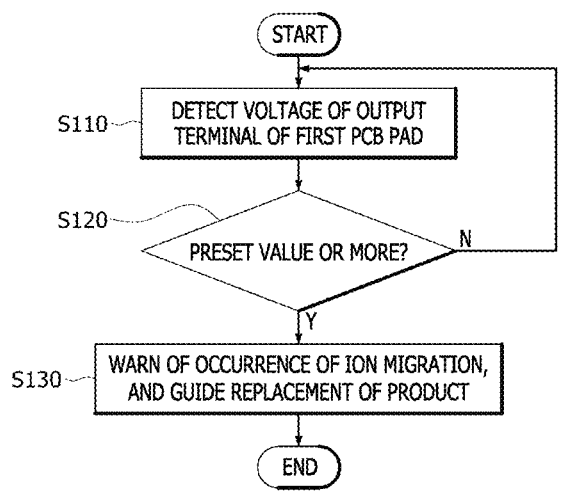
FIG. 5 is a diagram illustrating an example of a method for detecting ion migration in accordance with an embodiment of the present invention.

FIG. 5 is a diagram illustrating an example of the method for detecting ion migration in accordance with an embodiment of the present invention.

Referring to FIG. 5, the voltage detection unit 40 detects the voltage of the output terminal of the first PCB pad 10 (at step S110).

The control unit 50 determines whether the voltage detected by the voltage detection unit 40 is the preset value or more (at step S120). The case where the voltage detected by the voltage detection unit 40 is the preset value or more may refer to the case where leakage current occurs between the B+ terminal of the first PCB pad 10 and the GND terminal of the second PCB pad 20.

As a result of the determination at step S120, if the voltage detected by the voltage detection unit 40 is less than the preset value, the control unit 50 returns the process to step S110. On the other hand, if the voltage detected by the voltage detection unit 40 is the preset value or more, the control unit 50 determines that ion migration has occurred, and warns of contamination of the PCB through the warning unit 70, and controls the power disconnection unit 60 to interrupt the power to be supplied to the ECU. In addition, the control unit 50 guides replacement of a component, e.g., the ECU (at step S130).

Figure 6:
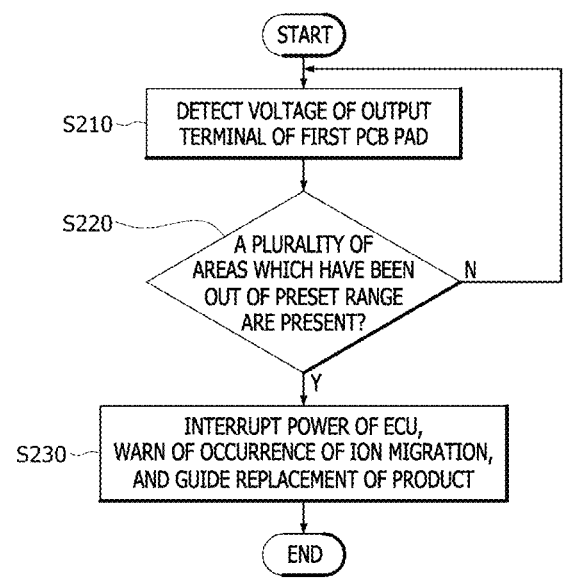
FIG. 6 is a diagram illustrating another example of the method for detecting ion migration in accordance with an embodiment of the present invention.

FIG. 6 is a diagram illustrating another example of the method for detecting ion migration in accordance with an embodiment of the present invention.

Referring to FIG. 6, the voltage detection unit 40 detects the voltage of the output terminal of the first PCB pad 10 (at step S210).

The control unit 50 determines whether the voltage detected by the voltage detection unit 40 is out of the preset range, and determines whether a plurality of areas in each of which the voltage detected by the voltage detection unit 40 is out of the preset range have been detected (at step S220). The case where a plurality of areas in each of which the voltage detected by the voltage detection unit 40 is out of the preset range have been detected may refer to the case where leakage current has occurred between circuit component lead pins or circuit component bodies in the ECU.

As a result of the determination at step S220, if a plurality of areas in each of which the voltage detected by the voltage detection unit 40 is out of the preset range have been detected, the control unit 50 determines that ion migration has occurred between the first PCB pad 10 and the second PCB pad 20.

Therefore, the control unit 50 that determines that ion migration has occurred warns of contamination of the PCB through the warning unit 70 and controls the power disconnection unit 60 to interrupt power to be supplied to the ECU. In addition, the control unit 50 guides replacement of a component, e.g., the ECU (at step S230).

As described above, an apparatus and method for detecting ion migration in accordance with an embodiment of the present invention may detect ion migration which occurs between PCB pads based on a change in voltage of the PCB pads due to by-products generated by the ion migration.

Furthermore, the apparatus and method for detecting ion migration in accordance with an embodiment of the present invention may rapidly and precisely detect ion migration and warn an occupant in a vehicle against malfunction of an ECU, and may interrupt the power when ion migration is detected, thus fundamentally preventing a fire from occurring due to a short circuit in the ECU.

While the present invention has been described with respect to the specific embodiment illustrated in the attached drawings, this is only for illustrative purposes, and it will be apparent to those skilled in the art that various changes and modifications may be made without departing from the spirit and scope of the invention as defined in the following claims. Therefore, the spirit and scope of the present invention should be defined by the accompanying claims.

What is claimed is:

1. An apparatus for detecting ion migration, comprising:
a first printed circuit board (PCB) pad coupled with a ground;
a second PCB pad disposed at a position spaced apart from the first PCB pad;
a power supply unit configured to supply power to the second PCB pad;
a voltage detection unit configured to detect a voltage of an output terminal of the first PCB pad;
a control unit configured to determine whether ion migration has occurred between the first PCB pad and the second PCB pad using the voltage detected by the voltage detection unit; and
a power disconnection unit configured to interrupt power to be supplied to an electronic control unit (ECU) or an actuator, when the control unit determines that ion migration has occurred between the first PCB pad and the second PCB pad.

2. The apparatus of claim 1, wherein the control unit determines whether the ion migration has occurred depending on whether the voltage detected by the voltage detection unit is a preset value or more.

3. The apparatus of claim 1, wherein the control unit determines whether the ion migration has occurred depending on whether a plurality of areas in each of which the voltage detected by the voltage detection unit is out of a preset range are present.

4. The apparatus of claim 1, wherein a facing surface of the first PCB pad and a facing surface of the second PCB pad each have a saw tooth shape.

5. The apparatus of claim 1, wherein a facing surface of the first PCB pad and a facing surface of the second PCB pad each have a shape with protrusions and depressions that are alternately formed.

6. The apparatus of claim 1, wherein a facing surface of the first PCB pad and a facing surface of the second PCB pad each have a wavy shape.

7. The apparatus of claim 1, further comprising a warning unit configured to warn of PCB contamination when the control unit determines that ion migration has occurred between the first PCB pad and the second PCB pad.

8. A method for detecting ion migration, comprising:
detecting, by a voltage detection unit, a voltage of an output terminal of a first printed circuit board (PCB) pad disposed at a position spaced apart from a second PCB pad;
determining, by a control unit, whether ion migration has occurred between the first PCB pad and the second PCB pad using the voltage detected by the voltage detection unit, and interrupting, by a power disconnection unit, power to be supplied to an electronic control unit (ECU) or an actuator, when the control unit determines that ion migration has occurred between the first PCB pad and the second PCB pad.

9. The method of claim 8, wherein, in the determining of whether the ion migration has occurred, the control unit determines whether the ion migration has occurred depending on whether the voltage detected by the voltage detection unit is a preset value or more.

10. The method of claim 8, wherein, in the determining of whether the ion migration has occurred, the control unit determines whether the ion migration has occurred depending on whether a plurality of areas in each of which the voltage detected by the voltage detection unit is out of a preset range are present.

11. The method of claim 8, wherein a facing surface of the first PCB pad and a facing surface of the second PCB pad each have a saw tooth shape.

12. The method of claim 8, wherein a facing surface of the first PCB pad and a facing surface of the second PCB pad each have a shape with protrusions and depressions that are alternately formed.

13. The method of claim 8, wherein a facing surface of the first PCB pad and a facing surface of the second PCB pad each have a wavy shape.

14. The method of claim 8, further comprising warning of PCB contamination, by a warning unit, when the control unit determines that ion migration has occurred between the first PCB pad and the second PCB pad.

* * * * *